United States Patent
Easley et al.

(10) Patent No.: US 10,652,689 B2
(45) Date of Patent: May 12, 2020

(54) CONFIGURABLE MULTI-BAND COMPRESSOR ARCHITECTURE WITH ADVANCED SURROUND PROCESSING

(71) Applicant: THAT CORPORATION, Milford, MA (US)

(72) Inventors: Matthew Easley, Woodstock, GA (US); Mikio Oda, Yawata (JP)

(73) Assignee: THAT Corporation, Milford, MA (US)

( * ) Notice: Subject to any disclaimer, the term of this patent is extended or adjusted under 35 U.S.C. 154(b) by 0 days.

(21) Appl. No.: 15/862,045

(22) Filed: Jan. 4, 2018

(65) Prior Publication Data
US 2018/0192229 A1 Jul. 5, 2018

Related U.S. Application Data (60) Provisional application No. 62/442,195, filed on Jan. 4, 2017.

(51) Int. Cl.
*H04S 7/00* (2006.01)
*H04R 3/14* (2006.01)
(Continued)

(52) U.S. Cl.
CPC ............ *H04S 7/307* (2013.01); *H03G 5/165* (2013.01); *H03G 9/025* (2013.01); *H04R 3/04* (2013.01);
(Continued)

(58) Field of Classification Search
CPC ...... H03G 3/3005; H03G 9/025; H03G 5/165; H04R 3/04; H04R 3/14; H04S 7/307;
(Continued)

(56) References Cited

U.S. PATENT DOCUMENTS 4,748,669 A * 5/1988 Klayman .................. H04S 7/30
369/86
5,054,071 A 10/1991 Bacon
(Continued)

FOREIGN PATENT DOCUMENTS

CN 1254153 C 4/2006
CN 102273224 12/2011
(Continued)

OTHER PUBLICATIONS

International Search Report and Written Opinion in corresponding international application PCT/US2018/012325 dated Apr. 3, 2018 (22 pages).
(Continued)

*Primary Examiner* — Davetta W Goins
*Assistant Examiner* — Kuassi A Ganmavo
(74) *Attorney, Agent, or Firm* — Cesari and McKenna, LLP (57) ABSTRACT

Audio processing architectures are described for implementing a multi-band audio compression algorithm with advanced surround processing. Exemplary architectures can improve the fidelity and perceived sound field spread of inexpensive, cabinet mounted, stereo speakers such as those that might be found in televisions, wireless speaker systems and sound bars. Embodiments of the present disclosure can improve inexpensive, cabinet mounted, stereo speakers by providing, e.g., (i) an Advanced Surround algorithm that adds depth and height to the left/right/center sound field images, (ii) a Soft Clip algorithm to minimize the perceived artifacts caused by compressor overshoot, (iii) configurable crossover filter order adjustment to allow better isolation between bands, (iv) a compressor maximum gain adjustment to reduce overshoot and minimize noise boost, and/or (v) a
(Continued)

center gain adjustment to emphasize the perception of the center image (dialog) in high ambient noise situations.

8 Claims, 7 Drawing Sheets

(51) Int. Cl.
    *H04R 3/04*     (2006.01)
    *H04S 1/00*     (2006.01)
    *H03G 5/16*     (2006.01)
    *H03G 9/02*     (2006.01)
    *H03G 11/00*     (2006.01)

(52) U.S. Cl.
    CPC ............... *H04R 3/14* (2013.01); *H04S 1/007* (2013.01); *H04S 7/30* (2013.01); *H03G 11/00* (2013.01); *H04S 1/002* (2013.01); *H04S 2400/13* (2013.01); *H04S 2420/07* (2013.01)

(58) Field of Classification Search
    CPC . H04S 7/30; H04S 1/007; H04S 1/002; H04S 2400/13; H04S 2420/07; H04H 60/73
    See application file for complete search history.

(56) References Cited

U.S. PATENT DOCUMENTS

| | | | | |
|---|---|---|---|---|
| 5,278,909 | A * | 1/1994 | Edgar | H04S 1/007 381/1 |
| 5,295,189 | A * | 3/1994 | Fosgate | H04S 3/02 381/22 |
| 5,708,718 | A * | 1/1998 | Ambourn | H04S 3/00 381/1 |
| 5,796,842 | A * | 8/1998 | Hanna | G10L 19/008 381/4 |
| 7,031,474 | B1 | 4/2006 | Yuen et al. | |
| 7,149,313 | B1 * | 12/2006 | Allen | H04S 3/00 381/22 |
| 8,315,411 | B2 | 11/2012 | Hanna et al. | |
| 9,380,385 | B1 | 6/2016 | Skinner | |
| 2003/0023429 | A1 * | 1/2003 | Claesson | G10L 19/0208 704/201 |
| 2006/0126851 | A1 | 6/2006 | Yuen | |
| 2008/0049944 | A1 * | 2/2008 | Omata | H04S 3/00 381/22 |
| 2008/0095378 | A1 | 4/2008 | Hanna | |
| 2009/0022328 | A1 | 1/2009 | Neugebauer | |
| 2010/0086149 | A1 * | 4/2010 | Kuroda | H03G 7/002 381/103 |
| 2010/0128904 | A1 * | 5/2010 | Hanna | H03G 3/3005 381/107 |
| 2010/0158259 | A1 | 6/2010 | Hanna et al. | |
| 2011/0196519 | A1 * | 8/2011 | Khoury | H04N 21/4104 700/94 |
| 2011/0280407 | A1 * | 11/2011 | Skinner | H03G 3/3005 381/28 |
| 2013/0108055 | A1 | 5/2013 | Hanna et al. | |
| 2013/0142339 | A1 * | 6/2013 | Engdegard | G10L 19/008 381/17 |
| 2014/0185829 | A1 * | 7/2014 | Bongiovi | G06F 3/165 381/103 |
| 2014/0376726 | A1 * | 12/2014 | Trammell | H04S 3/006 381/19 |
| 2015/0092973 | A1 * | 4/2015 | Risberg | H04R 3/04 381/337 |

FOREIGN PATENT DOCUMENTS

| | | |
|---|---|---|
| CN | 101855917 | 7/2016 |
| TW | 201308198 | 2/2013 |
| WO | 20120177572 A2 | 12/2012 |

OTHER PUBLICATIONS

Esqueda,. F., et al., 23rd European Signal Processing Conference, "Aliasing reduction in soft-clipping algorithms," EUSIPCO 2015 (Dec. 22, 2015) 2014-2018, 5 pages.

International Search Report and Written Opinion for corresponding Application No. PCT/US19/24216 filed Mar. 27, 2019, dated Jun. 21, 2019, 16 pages.

U.S. Appl. No. 12/949,397, filed Nov. 18, 2010, 15 pages.

* cited by examiner

① Delay (samples)  :  1 sample = 1/48KHz(fs) = 0.02ms
1000 samples = 0.02 × 1000 = 20ms delay time , 1500 samples =0.02 × 1500 = 30ms delay time ② : Impact of Feedback Delay Coeff ( impulse response )

③ reflect wave and reverb

There are many impulse patterns .   Room size,
                                   wall ,flour ,ceiling (figure and material)

The delay time depends on DSP data memory size.

CONFIGURABLE MULTI-BAND COMPRESSOR ARCHITECTURE WITH ADVANCED SURROUND PROCESSING

CROSS-REFERENCE TO RELATED APPLICATION

This application is based upon and claims priority to U.S. provisional patent application 62/442,195 entitled "Three Band Compressor with Advanced Surround Processing," filed 4 Jan. 2017. The entire content of this noted provisional application is incorporated herein by reference.

BACKGROUND

Technical Field

This disclosure relates to audio reception and playback, and more particularly to systems for and techniques of enhancing the fidelity and perceived sound field spread of inexpensive speakers typically incorporated into audio and video reception and playback devices such as televisions and computers.

Description of Related Art

Consumers are typically more sensitive to the quality of visual displays than they are to sound quality. In order to keep cost to a minimum, it is common for consumer electronics manufacturers of audio and video systems, such as televisions and computers, to install small, inexpensive speakers in the systems. These speakers typically exhibit poor fidelity and perceived sound field spread. Consumers seeking to overcome those sound problems typically buy and add high-end speakers as the audio and video reception and playback systems are usually configured so that additional speakers can be connected to the audio and video reception and playback systems for improving the quality of the audio portion of any programming.

SUMMARY

The present disclosure describes implementations of and architectures for implementing a multi-band (e.g., three-band) audio compression algorithm with advanced surround processing. Embodiments of the present disclosure can accordingly improve the fidelity and perceived sound field spread of inexpensive, cabinet mounted, stereo speakers such as those that might be found in televisions, wireless speaker systems and sound bars. Embodiments of the present disclosure can improve inexpensive, cabinet mounted, stereo speakers by providing, e.g., (i) an Advanced Surround algorithm that adds depth and height to the left/right/center sound field images, (ii) a Soft Clip algorithm to minimize the perceived artifacts caused by compressor overshoot, (iii) configurable crossover filter order adjustment to allow better isolation between bands, (iv) a compressor maximum gain adjustment to reduce overshoot and minimize noise boost, and/or (v) a center gain adjustment to emphasize the perception of the center image (dialog) in high ambient sound situations.

It may be desirable to have different configurations of these architectures and/or algorithms, depending upon the type of audio source material. For example, while watching an action movie, a listener may be interested in a strong audio surround effect. Embodiments of the present disclosure can accordingly provide enhanced audio surround effect(s). As another example, when listening to music, a listener may be less interested in a surround effect and more interested in high fidelity, a concert hall effect, or increased bass. A listener to a sporting event may be interested in hearing the announcer clearly over the crowd noise and public address system while still trying to maintain the ambiance of a stadium environment. The improvements and configurability of the architectures and algorithms of the present disclosure can thus provide the implementation of multiple audio enhancement modes to facilitate different types of audio material and the listener's taste.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described and/or with the component order changed.

Figure 1:
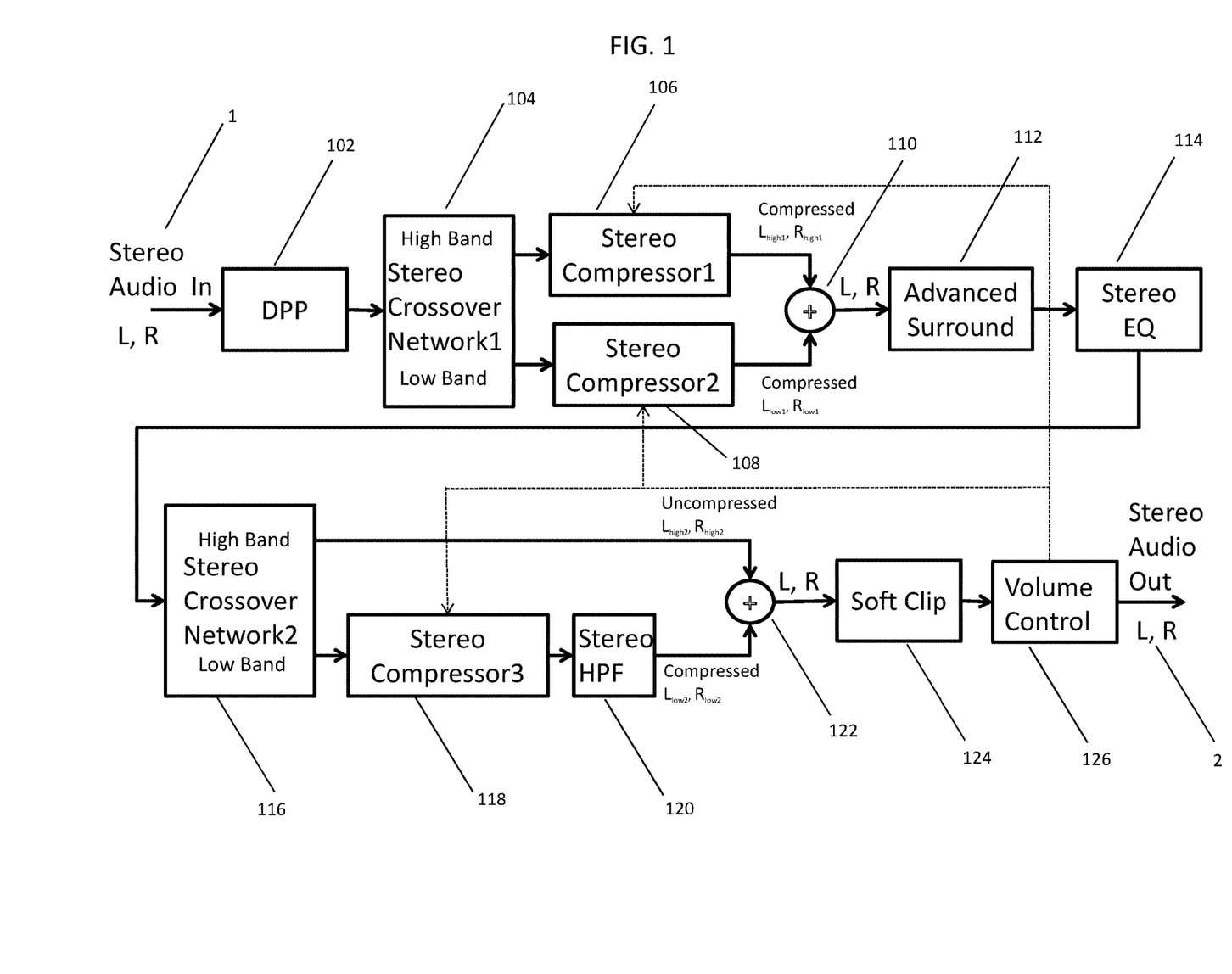
FIG. 1 is a box diagram showing components of an audio signal processing architecture and processing sequence according to an exemplary embodiment of the present disclosure.

FIG. 1 is a box diagram showing components of an audio signal processing architecture 100 and processing sequence according to an exemplary embodiment of the present disclosure. All audio connections (indicated by solid lines) between blocks should be regarded as stereo (Left and Right) signals. Architecture 100 includes a dual processing protection (DPP) block 102 that receives unprocessed stereo (Left and Right) input 1 and adjusts the difference to sum ratio ((L−R)/(L+R)), a first cross over network (indicated as Stereo Crossover Network1) 104, which separates a stereo audio input into stereo high and low bands, first and second compressors (indicated as Stereo Compressor1 and Stereo Compressor2) 106 and 108 that output compressed stereo in high and low bands ($L_{high1}/R_{high1}$) and ($L_{low1}/R_{low1}$), respectively, a first stereo summing unit 110 that sums a compressed stereo $L_{high1}/R_{high1}$ input with a compressed stereo $L_{low1}/R_{low1}$ input, an Advanced Surround processing unit or block 112, which introduces a perceived multidimensional surround effect, and Stereo EQ 114. As shown, architecture 100 also includes a second crossover network (indicated as Stereo Crossover Network2) 116, a third compressor (Stereo Compressor3) 118 that outputs a compressed low band signal, a stereo high-pass filter (HPF) 120 to remove low frequencies that cannot be reproduced by the speakers that outputs ($L_{low2}/R_{low2}$), a second stereo summing unit 122 that sums an uncompressed stereo $L_{high2}/R_{high2}$ input with a compressed and high pass filtered stereo $L_{low2}/R_{low2}$ input, Soft Clip unit 124 which clips and smooths the stereo signal, and volume control unit 126 which adjusts the level of the stereo input signal and outputs a processed stereo signal indicated as output 2 and, in the embodiment shown, feeds back the volume control setting to blocks 106, 108, and 118.

When the volume control is positioned as shown in FIG. 1, the volume control setting can be configured to feedback to the compressors (as shown by dashed line). Exemplary configurable parameters for each component are described below (of course others are within the scope of the present disclosure):

DPP: (L−R/L+R) Ratio Threshold and Center Gain;
Crossover networks: Crossover Frequency, Crossover Order;
Compressor1: Target Level, Noise Gate, Attack Threshold, Release Threshold, Maximum Compressor Gain, Above Threshold Compression Ratio and Below Threshold Compression Ratio;
Compressor2: Target Level, Noise Gate, Attack Threshold, Release Threshold, Maximum Compressor Gain, Above Threshold Compression Ratio, Below Threshold Compression Ratio and Coupling (with Compressor1) adjustment;
Advanced Surround: Width, Sum Feedback Delay, Sum Feedback Delay Coefficient, Sum Delay Gain, Difference Feedback Delay, Difference Feedback Delay Coefficient, Difference Delay Gain, Diff Channel EQ Parameters; and
EQ: Center Frequency, Q and Gain for each of seven EQ filters.

In exemplary embodiments, a preferred configuration involves configuring DPP 102, Crossover Network1 104, Compressor1 106 and Compressor2 108 as a dynamic volume control (DVC) and also includes the EQ 114, Crossover Network2 116, Compressor3 118, and HPF 120 configured for compressor-based bass enhancement. Examples of suitable EQs used with a crossover network and a compressor for dynamic volume control include, but are not limited to, those disclosed in co-owned U.S. Pat. No. 9,380,385 filed 14 Mar. 2014 and entitled "Compressor Based Dynamic Bass Enhancement with EQ," the entire content of which is incorporated herein by reference. Examples of suitable DPPs used with crossover networks and compressors for dynamic volume control include, but are not limited to, those disclosed in co-owned U.S. Pat. No. 8,315,411 filed 16 Nov. 2009 and entitled "Dynamic Volume Control and Multi-Spatial Processing Protection," the entire content of which is incorporated herein by reference. Another configuration, described in the present disclosure, uses Advanced Surround for a concert hall effect. While still another configuration utilizes the DPP Target Sum/Difference ratio, DPP center gain and Advanced Surround to create a sports listening mode effect. And, still another configuration uses Compressor2 and Compressor3 together to create an improved bass enhancement effect.

Figure 2:
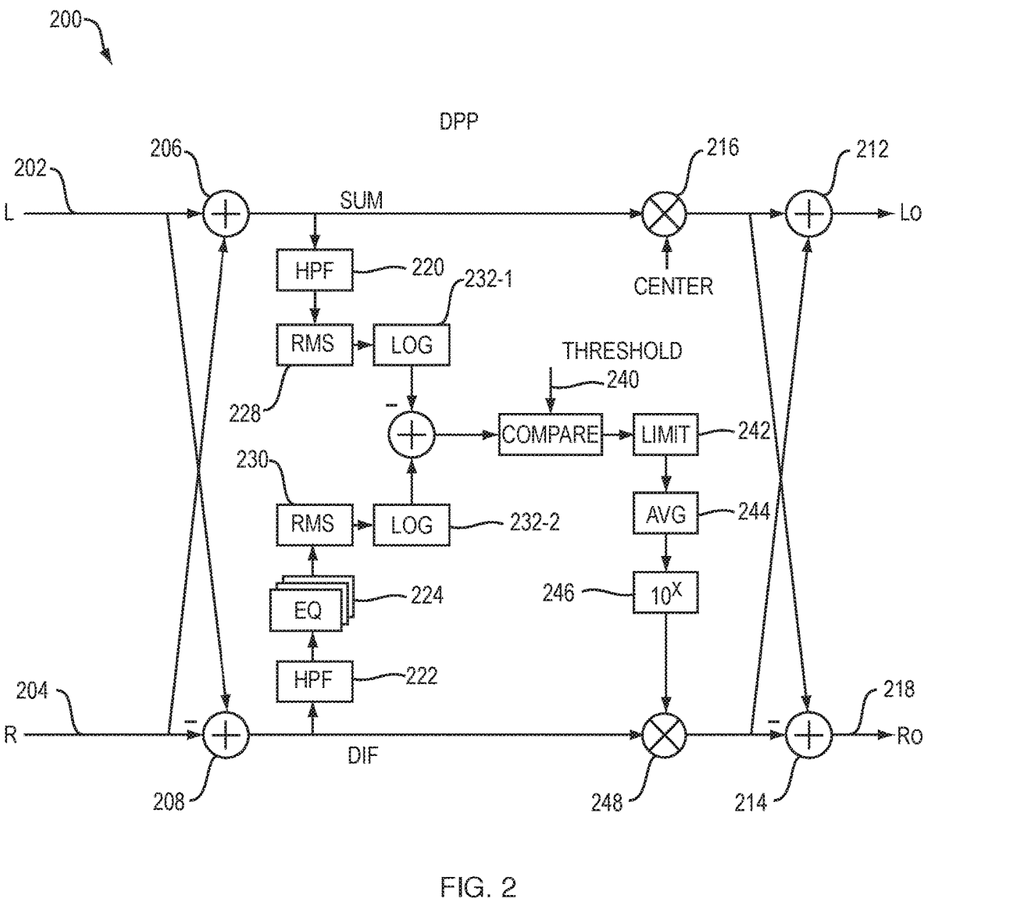
FIG. 2 depicts a block diagram of an exemplary embodiment of a dual processing protection (DPP) architecture in accordance with the present disclosure.

FIG. 2 depicts a block diagram of an exemplary embodiment of a dual processing protection (DPP) architecture 200 in accordance with the present disclosure. Dual processing protection (DPP) is one form or embodiment of a more general Multi-Spatial Processing Protection (MPP), which can refer to the processing of two or more sound channels (e.g., L and R channels). Television manufacturers often include virtual surround (pseudosurround) technology (e.g., SRS Tru-Surround, Spatializer, etc.) in the two-channel television audio output path. This two-channel television audio may go to speakers external to the television or to speakers mounted in the television enclosure. These virtual-surround technologies create the illusion of surround sound by manipulating and enhancing the difference channel (L−R) present in stereo broadcasts. The listener still perceives an intact center image (L+R) but also often hears the difference channel (L−R) either widened over a broad soundstage or as a point source located somewhere other than the speaker locations. Often this type of spatial enhancement is done during the production of the audio programming. This is especially true of television commercials which are enhanced to grab the listener's attention. When an audio program has two cascaded stages of spatial enhancement (for example at the point of production and in a television's audio processing) there can be significant degradation in the audio quality. The preprocessed audio tends to have significant L-R energy relative to L+R energy. The second, cascaded stage, of spatial enhancement processing tends to increase the amount of L−R energy even more. Recent studies have shown that excessive amounts of L−R enhancement is one of the top factors in listener fatigue. There also can be a significant volume increase. Accordingly, in accordance with one aspect of the present disclosure, a MPP system is provided. In exemplary embodiments, the MPP is a double processing protection (DPP) system that is a part of a television audio signal reception and playback system, prior to the television's stereo enhancement technology. The MPP system may be referred to as a pseudosurround signal processor. An exemplary DPP system processes the audio signals so as to minimize the difference (L−R) enhancement (minimizing or reducing the energy level of the difference (L−R) signal relative to the sum (L+R) signal) introduced at the point of production. This allows the television's spatial enhancement technology to process the audio signals in a manner that is psychoacoustically pleasing to the listener. The cascade of the DPP system before the television's spatial enhancement audio processing can be quite effective in mitigating the harsh effects of double spatial processing. In one embodiment the DPP system can be entirely digital and can be implemented economically in software (C, assembly language, etc.) or digital hardware (HDL description). It should be appreciated that the DPP system can also be all analog, or a hybrid of analog and digital components.

The DPP 200 functions to limit the difference to sum ratio (L−R/L+R) based upon the Threshold setting. It should be noted that by adjusting the Center gain, the sound field collapses proportionally into the center image, while boosting the sum channel, drawing the listener's attention to the center image which is typically the program dialogue. A detailed description of this function is provided in co-owned U.S. Pat. No. 8,315,411 filed 16 Nov. 2009 and entitled "Dynamic Volume Control and Multi-Spatial Processing Protection," the entire content of which is incorporated herein by reference.

Referring to the DPP system 200 shown in FIG. 2, a left signal (L) and right signal (R) are respectively applied to the inputs 202 and 204 of system 200. The L and R signals are applied to matrices represented by the two signal summers 206 and 208. Signal summers 206 and 208 constitute the matrix which provides the SUM (L+R) and DIF (L−R) signals. In the sum (L+R) path, the signal is generally untouched. The SUM signal usually contains audio content which does not necessarily need to be localized. However, in alternate embodiments, frequency contour shaping can be performed to enhance audio content such as dialogue. As shown, the SUM signal is multiplied by a Center constant at signal multiplier 210 prior to be provided to matrices illustrated as signal summers 212 and 214. The Center constant allows the level of the center image (L+R) to be adjusted, if desired, to aid in intelligibility of dialogue. Adding the L+R and L−R signals provides the left output signal Lo at output 216, while subtracting the L−R from the L+R provides the right output signal Ro at output 218.

In the illustrated embodiment of FIG. 2, most of the processing occurs in the DIF (L−R) path. L+R and L−R are compared to determine the level of the L−R signal relative to L+R. Before comparison, these two SUM and DIF signals can be each passed through a respective high pass filter 220 and 222, such as in circumstances where the speaker frequency response does not include low frequencies. The L−R DIF signal can further be passed through a multi-band equalizer 224 to accentuate the frequencies the human ear is most sensitive to, namely mid-range frequencies, to compensate for the perceived loudness level of the L−R signal. Equalizer 224 allows the difference channel level detection to be frequency dependent. For example, low frequency signals may be minimized when processing for inexpensive television speakers with limited bass response. High frequencies may be minimized to limit the response to transient audio events. Typically mid-range frequencies, where the ear is most sensitive, are equalized to dominate the difference level detection. Once the levels of the difference and sum signals are calculated the DIF/SUM ratio is determined.

Each of these signals is then run through a respective signal level detector 228 and 230. The detectors listed above can be used, such as an RMS level detector, although any type of level detector (such as the ones described above) can be used. Also, the processing can all be performed in the log domain to increase efficiency by processing them through the log domain processing blocks 232-1 and 232-2.

The outputs of the blocks 232-1 and 232-2 are applied to the signal summer wherein the processed SUM signal is subtracted from the processed DIF signal. Subtracting one signal from the other in the log domain is the same as providing a signal that is the ratio of the process SUM signal to that of the DIF signal in the linear domain. Once the L+R and L−R signal levels are calculated, where the L-R signal level may have been equalized prior to level detection to increase the mid-range frequencies, these two signal levels are compared by the comparator 238 to a preset threshold 240. The ratio between the two signals ((L−R)/(L+R)) is compared to a threshold ratio by comparator 238 in order to determine the recommended L-R signal gain adjustment. A limiter stage 242 may be used to limit the amount and direction of gain applied to the L-R signal. The illustrated embodiment limits the gain at 0 dB hence only allowing attenuation of the L-R signal, although in some applications, there may be a desire to amplify the L-R signal. An averaging stage 244 averages, with a relatively long time constant, the output of the limiter stage 242 so as to prevent the DPP system from tracking brief transient audio events. After conversion back to the linear domain by linear domain block 246, the level of the L-R signal is correspondingly adjusted by the signal multiplier 248 to achieve that target ratio.

Figure 3:
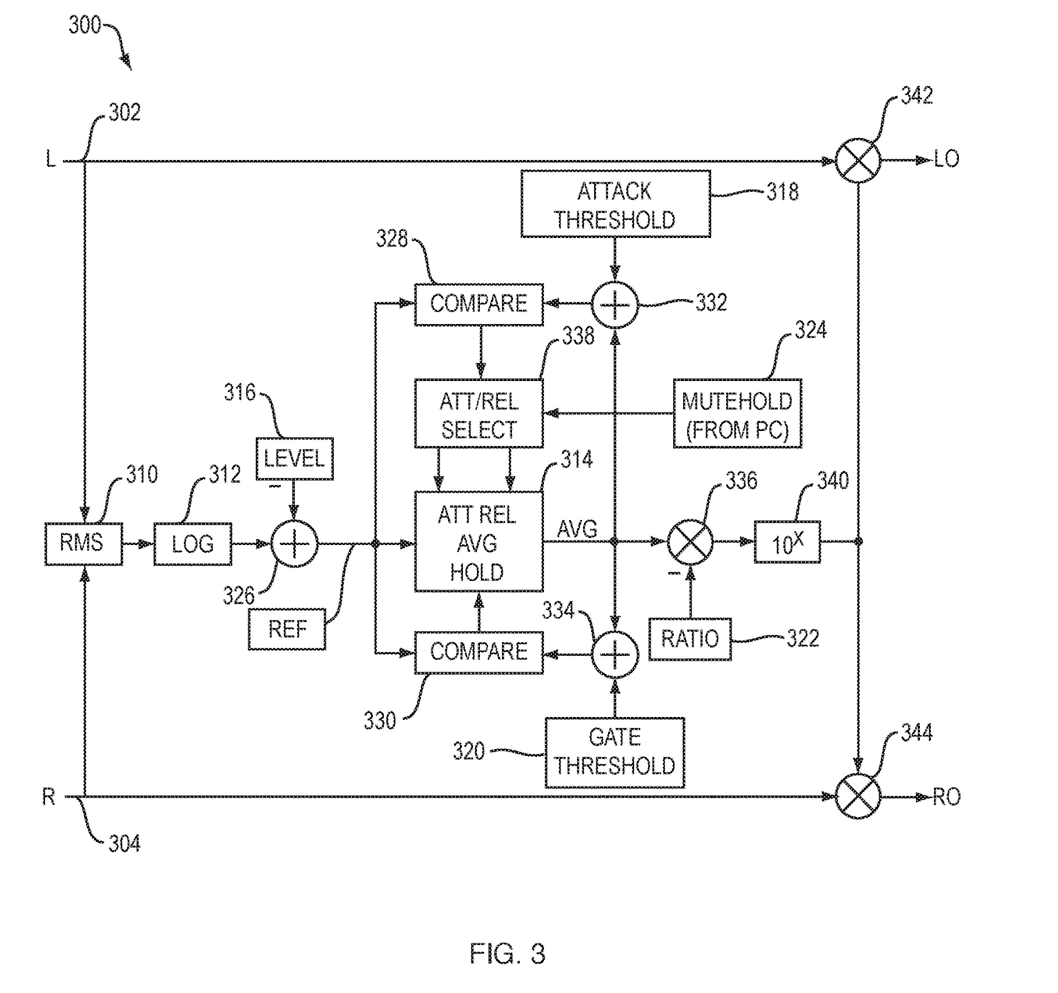
FIG. 3 depicts a diagram of an exemplary embodiment of a single compressor in accordance with the present disclosure.

FIG. 3 depicts a diagram of an exemplary embodiment of a compressor architecture 300 (e.g., as can be used for Compressor1, Compressor2 and/or Compressor3 for the embodiment of FIG. 1) is shown in FIG. 3. A detailed description of a similar compressor architecture is provided in co-owned U.S. Pat. No. 8,315,411. As shown in FIG. 3, architecture 300 receives two input signals, a left signal L at input 302 and a right signal at input 304. In exemplary embodiments, the DVC system architecture may be based upon a digital implementation of a classic compressor design (THAT Corporation Design Note 118) with flexibility and additional modifications that are only possible in a digital implementation. System 300 can include an RMS level detector 310 for providing a signal representative of the sum of the RMS averages of the left and right signals L and R, log conversion block 312, and a signal averaging AVG block 314. Log conversion block 312 112 converts the output of the RMS level detector 310 from the linear to the logarithmic domain. System 300 is responsive to a number of control signals each indicative of whether a certain condition exists requiring a response from the system. The system 300 may also include a host processor (not shown) configured and arranged for carrying out the operating of the DVC system 300. The illustrated embodiment is responsive to a number of control signals including: a target level signal provided by the target signal generating device 316, an attack threshold signal generated by the attack threshold signal device 318, a release threshold (not shown), a gate threshold signal generated by the gate threshold signal device 320, an. attack ratio threshold (not shown), a release ratio threshold (not shown), a ratio signal generated by the ratio signal device 322, and a mute hold signal generated by mute hold device 324 responsive to a program change detector (PCD—not shown). Devices (or components) 316, 318, 320, 322 can simply be adjustable user controls accessible to the user. Device 324 can be arranged to receive a signal from the TV controls when the channel changes or from a mute detector (not shown) that detects if inputs 302 and 304 have both been muted. The target signal level 316 represents the level in dB, relative to a full scale input, that is the target volume. The attack threshold 318 represents the number of dB that REF (output of summer 326) must be above AVG before the attack time is reduced by a factor of N, where N can be any number. In one illustrated embodiment N=10. The release threshold signal preferably represents the number of dB that REF must be below AVG before the release time is reduced by a factor of M, where M can be any number, and in one illustrated embodiment M=10. The Gate threshold 320 120 represents the amount, a negative dB number, that REF can go below AVG before all left and right gain adjustments are frozen. The attack ratio threshold represents the absolute amount, in dB, that REF can go above the target signal level 316 before the volume control begins attenuating the input signal. The release ratio threshold represents the absolute amount, in dB, that REF can go below the target signal level 316 before the volume control begins adding gain to the input signal. The ratio signal 322 adjusts the AVG value by the desired compression ratio.

Target level signal 316 is subtracted from the output of log conversion block 312 by signal summer 326 so as to provide the REF signal to the signal averaging AVG block 314, a comparator 328 and a second comparator 33o. The REF signal represents the volume level of the input signal relative to the desired listening threshold. The AVG signal can also be thought of as the instantaneous (prior to attack/release processing) ideal gain recommendation. The output of the signal averaging block 314 is the AVG signal, which is a signal that is a function of the average of the REF signal. The AVG signal is applied to the signal summer 332 where it is added to the attack threshold signal 318 118. In a similar manner (not shown) the AVG signal is summed with a release threshold. The AVG signal is also applied to the signal summer 334 where it is added to the gate threshold signal 320. The output of signal summer 332 is applied to attack threshold comparator 328 where it is compared to the REF signal, while the output of signal summer 334 is applied to gate threshold comparator 330 where it is compared to the REF signal. The AVG signal is also multiplied by the ratio signal 322 by the signal multiplier 336. The output of comparator 328 is applied to the attack/release selection block 338, which in turn provides either an Att (attack) signal, or a Rel (release) signal to the signal averaging block 314, dependent on and responsive to the status of the mute hold signal 324. The output of the release threshold AVG summer (not shown) is also compared to the REF signal and is applied to the attack/release selection block. The comparator 330 provides an output to the HOLD input of signal averaging block 314. Finally, the signal multiplier 336 provides an output to a log-to-linear signal converter 340, which in turn provides an output which is applied to each of the signal multipliers 342 and 344, wherein it respectively scales the left and right signal provided at the corresponding inputs 302 and 304 so as to provide the output modified left and right signals Lo and Ro.

With continued reference to FIG. 3, the RMS level detector 310 senses the sound level of the input signal. It should be noted that while an RMS level detector is shown, any type of signal level detector can be used. For example, a peak detector, average detector, perception based level detector (such as the ITU 1770 loudness detector or the CBS loudness detector), or other detector can be used to sense the sound level. These level detectors usually have time constants which are dynamically and independently adjustable. One method of adjusting these time constants is to base them on the envelope or general shape of the input signal so that the time constants vary with the signal. In other embodiments, the time constants are fixed. For ease of data processing, the sound level can be converted into the log domain, as shown, using log conversion block 312. In a multi-band system, a separate RMS detector can be used for each band. The signal averaging block 314 is configured and arranged so as to compute the average of REF relative to the attack and release times. The output signal AVG of the signal averaging block 314 is adjusted by the desired compression ratio, via multiplier 336, to create the gain value to be applied. Finally the gain is converted back into the linear domain by the log-to-linear converter 340 for application to the left and right signals L and R so as to produce the modified left and right signals Lo and Ro.

A target output level represented by the target level signal 316 is subtracted from the sensed level at the output of the log conversion block 312 to determine the difference between the actual and desired sound level. This difference, which represents the level of the input signal relative to the target level signal 316, is known as the reference (REF) signal. The target level signal can be a user input, such as a simple knob or other pre-set setting, so as to control the level of sound desired. This threshold can be fixed or it can be changed as a function of the input signal level to better position the compression relative to the input dynamic range. Once REF signal is obtained, it is provided as an input to the averaging block 314, attack threshold comparator 328 and gate threshold comparator 330 130. The output of attack threshold comparator 328 is applied to the attack/release select block 338, which in turn can receive a signal (e.g., a MuteHold signal 324) from a program change detector.

The gate threshold signal 32o when added to the current average AVG represents the lowest value REF is able to achieve before left and right gain adjustment (342 and 344) are frozen. The gate threshold comparator 330 receives the instantaneous signal level (REF) signal and determines if the sound level represented by REF drops below the given aforementioned threshold. If the instantaneous signal level (REF) is more than the amount of the gate threshold below the averaged signal level (AVG) appearing at the output of block 314, the gain applied to the signal in the signal path is held constant until the signal level rises above the threshold. The intent is to keep the system 300 from applying increased gain to very low level input signals such as noise. In an infinite hold system, the gain can be constant forever until the signal level rises. In a leaky hold system, the gain can be increased at a gradual pace (much slower than the release time). In one embodiment, this gate hold threshold is adjustable, while in another embodiment the threshold set by gate threshold 334 is fixed. A detailed description of a similar suitable compressor architecture is provided in co-owned U.S. Pat. No. 8,315,411, which is incorporated by reference herein in its entirety.

The architecture 300 preferably (but not necessarily) has an adjustable maximum limit to the gain applied to the L and R channel. By limiting the maximum gain, one can minimize the effects of compressor overshoot when the source material transitions from very quiet to very loud such as when a television program transitions to a loud commercial. Additionally, a maximum gain limit allows one to minimize the noise boost that can occur when the audio is quiet. This is especially important for analog input sources or older program material that has a high noise floor.

In exemplary embodiments, the DPP 102, Crossover Network1 104, Compressor1 106 and Compressor2 108 components can be configured as a volume control with multispatial processing protection similar to as described in U.S. Pat. No. 8,315,411. Examples of suitable compressor blocks (or subsystems) include, but are not limited to, those disclosed in co-owned U.S. Pat. No. 8,315,411.

The Volume Control 126 setting is provided to Compressor) and Compressor2 (dashed line on FIG. 1) as an optional means to automatically adjust the Compressor target level 316 as a function of the system Volume Control setting. This Volume Control feedback would be valuable if the compressors were configured as signal level limiters with high compression (1000:1 ratio) above threshold and no compression (1:1 ratio) below threshold. As the volume level is decreased the feedback would allow the compressor target level to increase thus ensuring that the maximum allowed signal level is always possible at the speaker terminals.

Conversely, as the volume level increases the compressor targets can be lowered to ensure that the maximum allowed signal will not be exceeded at the speaker terminals.

Figure 4A:
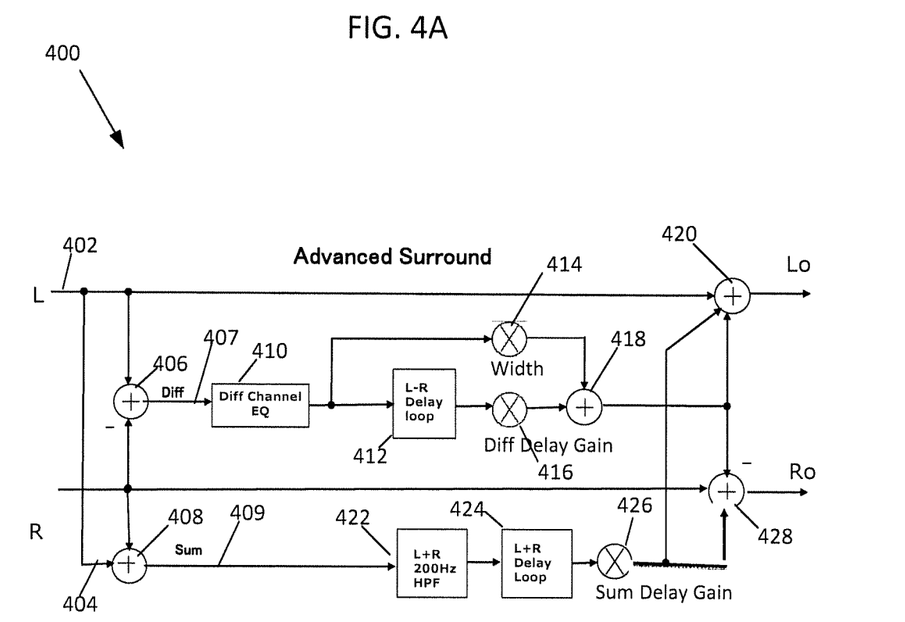
FIG. 4A depicts a diagram of an exemplary embodiment of an advanced surround (AS) architecture in accordance with the present disclosure.
Figure 4B:
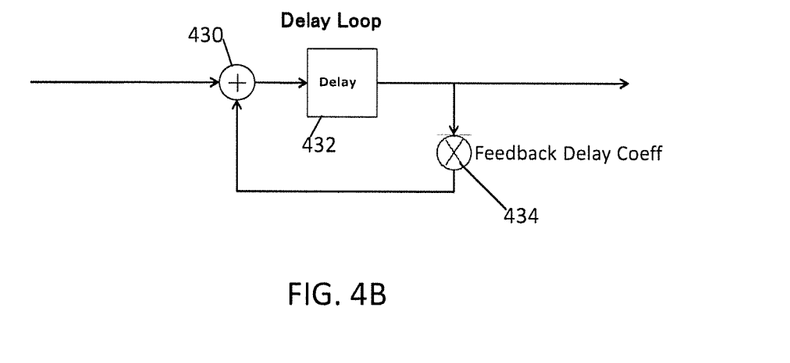
FIG. 4B depicts a diagram of an exemplary delay-loop in accordance with the present disclosure.

A diagram of an exemplary embodiment of an Advanced Surround architecture/system 400 is shown in FIG. 4A. FIG. 4B shows a detailed diagram of the delay loop. Architecture 400 includes left and right channels 402 and 404; signal flows are indicated by arrows. As shown in FIG. 4A, the Advanced Surround architecture 400 includes summers (summing units) 406 and 408 that each receive the Left and Right channels 402 and 404. Summer 406 is configured to invert one input so it effectively acts as a subtracting unit. The summing units 406 and 408 produce difference 407 and sum 409 channels as outputs, respectively. Difference EQ 410 in the difference channel 407 preferably focuses on middle frequencies, which are the ones the human ear is most sensitive to; it may be desirable in some applications to single out or separate out those so they will dominate the spatialization, spreading and adding multiple dimensions to the spatialization. The difference channel also includes a delay loop 412 and multipliers 414 and 416 for impressing width and gain inputs/values; summer 418 is also present to combine the width adjusted difference channel with the diff delay gain adjusted difference delay output. The sum channel 409 can include a HPF filter 422 to filter out low frequency signals as those signals typically do not add much to perceived spatialization; HPF filter 422 is preferably present but is optional. The sum channel 409 can also include a delay loop 424 and a summer 426 for setting (impressing) a delay gain. Summing units 420 and 428 are also present.

Referring to FIG. 4B, an exemplary embodiment of a delay loop, e.g., 412 and 424 in FIG. 4A, is shown. The delay loop can include a summer 430, a delay unit 432, and a multiplier 434 for setting or impressing a feedback delay coefficient. Other architectures may be used for delay loops within the scope of the present disclosure. The Delay Loop architecture is repeated as the L-R Delay Loop and L+R Delay Loop. The Advanced Surround parameters Width, Diff Delay Gain, Sum Delay Gain, Delay (in Delay Loop) and Feedback Delay Coefficient (in Delay Loop) all correspond to adjustable parameters. Setting the Diff Delay Gain and Sum Delay Gain to zero (i.e., no signal passes) transforms the algorithm to be similar to a pseudo-surround two channel processing algorithm as disclosed in co-owned U.S. patent application Ser. No. 12/949,397, which algorithm is typically used in many consumer electronics applications. Co-owned U.S. patent application Ser. No. 12/949,397 filed 18 Nov. 2010 and entitled "Virtual Surround Signal Processing" is incorporated in its entirety herein by reference. With continued reference to FIGS. 4A and 4B, the Width parameter adjusts the level of sound field spread as is traditionally done. The Delay Loop provides an example of a means to model near and far reflections of both the Sum and Diff signals.

Figure 5:
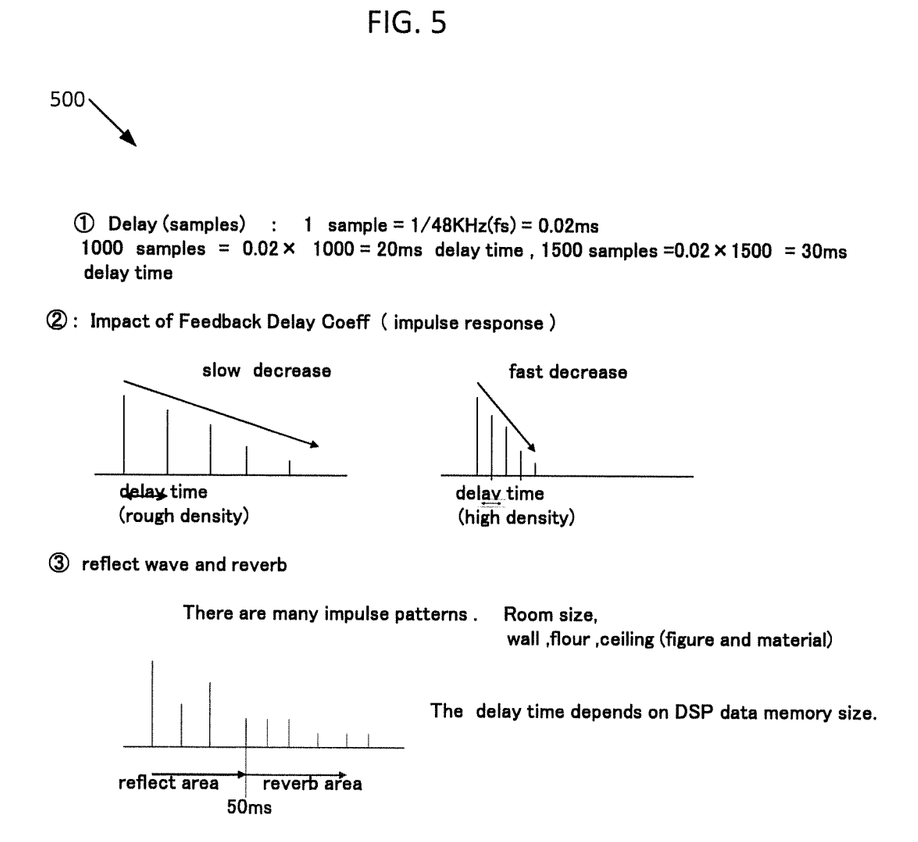
FIG. 5 depicts examples of delay-loop configurations according to an embodiment of the present disclosure.

FIG. 5 provides more detail on how one might configure the sum and difference delay loops for exemplary embodiments. FIG. 5.1 shows how to configure the Delay, e.g., for 20 ms or 30 ms based upon a 48 kHz sample rate; other sampling rates may of course be utilized. FIG. 5.2 shows the impact of the Delay and feedback coefficient settings on the Delay Loop impulse response. The Delay setting determines the time gap between the non-zero values of the impulse response. The Feedback Delay Coefficients are limited to values e.g., less than or equal to 0 and greater than -1. The higher the absolute value of the Feedback Delay Coefficient, the slower the decrease of the impulse response. FIG. 5.3 defines the early reflection and reverb areas of an acoustic impulse response. One can see that by appropriate choice of the Delay, Feedback Delay Coefficient and the Delay Gain the impulse response of the L+R and L-R can be independently configured to position energy, as needed, in the early reflection and late reflection (reverberant) regions.

This architecture allows the summation of a scaled amount of sum and difference reflection/reverb with prior art processing before the entire signal is combined back with the left and right channels. The prior art algorithm is good at spreading the perceived sound field, for two stereo speakers, in the horizontal direction. The addition of reflection/reverb modelling, to the prior art, as shown in FIGS. 4A and 4B, adds depth, some height and additional width perception to the virtual sound field resulting in a perceived 3D sound effect. The trade-off in providing this width/depth/height expression, via digital delay reflection and reverb modelling, is audio clarity. It should be used subtly when the desire is to provide more fidelity to inexpensive speakers and more strongly when the desire is to create the ambience of a concert hall, theater or sporting event. It should be noted that more sophisticated reflection/reverb modelling techniques can be used, such as those that model the impulse responses of theaters and concert halls, to produce an even more configurable and pleasing effect (though with much increased implementation complexity).

Figure 6:
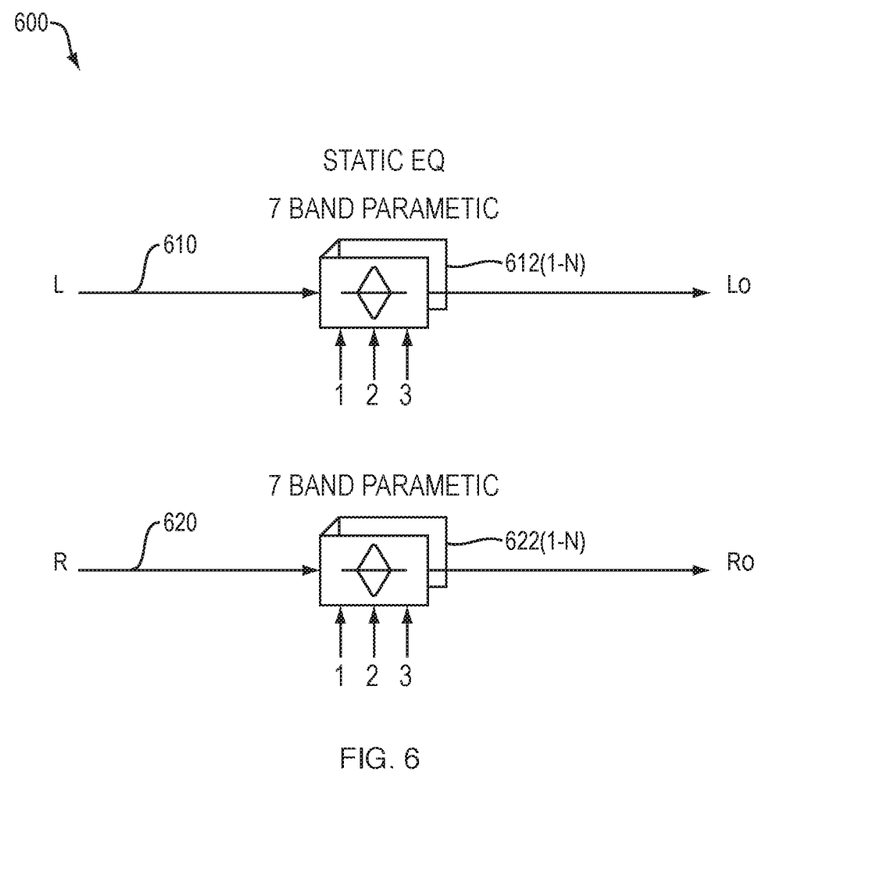
FIG. 6 depicts a diagram of an exemplary embodiment of a static equalizer (EQ) in accordance with the present disclosure.

FIG. 6 depicts a diagram of an exemplary embodiment of the Static EQ 600. Left and right channels 610 and 620 are indicated as having configurable parametric EQ 612 and 622, respectively. In the embodiment shown, seven configurable parametric EQ second-order sections are configured in both left and right channels. Of course, other embodiments of a static EQ, e.g., of different order and number of sections, may be utilized within the scope of the present disclosure; moreover, dynamic EQ may be used in addition or substitution.

One preferred embodiment of Compressor3 involves Volume Control feedback. The Volume Control setting can be provided, as feedback, to Compressor3 118 (dashed line on FIG. 1) as an optional means to automatically adjust the Compressor target level (Level 316 in FIG. 3) as a function of the system Volume Control setting. For example, this volume level feedback is useful when Compressor3 118 is configured in a bass enhancement configuration. As the volume level is decreased the feedback would allow the compressor target level to increase thus ensuring that the maximum bass level is always possible at the speaker terminals. Conversely, as the volume level increases the compressor targets can be lowered to ensure that the maximum allowed bass level will not be exceeded at the speaker terminals. An embodiment utilizes Compressor2 108 in conjunction with Compressor3 118 to provide even better system bass response in a bass-emphasized music configuration. A diagram of another exemplary embodiment of Crossover Network2 116, Compressor3 118 and HPF 120, in a Bass Enhancement configuration, is described in detail in co-owned U.S. Pat. No. 8,315,411.

The preferred instantiation of the Soft Clipper is a hard limiter followed by a smoothing polynomial. Suitable smoothing polynomials include, but are not limited to, the type described in the paper Esqueda, F., et al., 23rd European Signal Processing Conference, "Aliasing reduction in soft-clipping algorithms," EUSIPCO 2015 (Dec. 22, 2015): 2014-2018, a copy of which is submitted with and incorporated into this application; one such suitable the polynomial is $y=(3x/2)(1-x^2/3)$, where y is the clipper output, is utilized in a preferred static soft clipping instantiation. Other smoothing polynomials and methods may be used, e.g., other methods based on the ideal band limited ramp function (BLAMP), or the polyBLAMP polynomial approximation method, etc. A hard clipper alone can produce a harsh audio artifact during compressor overshoot. A true limiter may be computationally intensive and require significant processor bandwidth and memory. A soft clipper represents a good compromise that minimizes the perceived audio artifacts for brief audio excursions above full scale.

This configurable multi-compressor (e.g., three-compressor) system can be utilized to enhance the listener experience for different types of program material. For example, it can be configured in a music mode with an emphasis on bass. It can be configured in a concert hall mode with emphasis on echo and reverberation. It can also be configured in a live sporting event mode that emphasizes the announcer's voice while maintaining the ambience of a stadium environment. There are many other possible configurations such as HiFi, News and Theater modes, etc.

Figure 7:
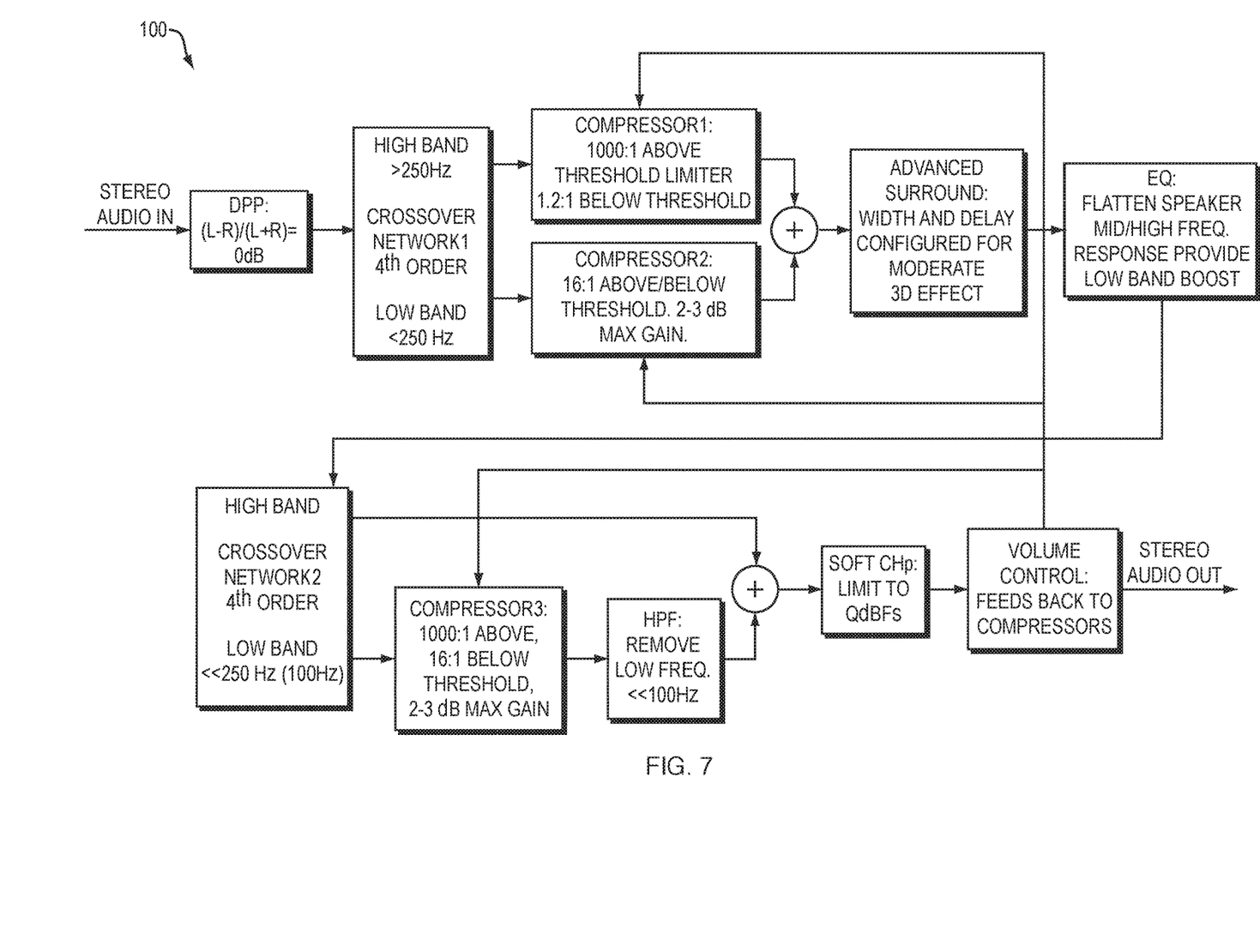
FIG. 7 shows an example of the Multi Band Compressor Architecture of FIG. 1 configured in bass-emphasized music mode.

Exemplary Embodiments are described below with respect to features and components descried above and shown in the drawings:

Music Mode:

An example of a bass-emphasized music mode will now be described. It is assumed that the system utilizes an inexpensive set of speakers which have a low-end frequency response that extends to, e.g., about 250 Hz. This mode utilizes two compressors (Compressor2 and Compressor3) and EQ to enhance bass. FIG. 7 shows an example of the Multi Band Compressor Architecture 100 of FIG. 1 configured in a bass-emphasized music mode. An example bass-emphasized music mode configuration is described below.

DPP 102: Limit the L−R/L+R ratio to 0 dB.

Compressor1 106: Configured separately to limit the level in the mid and high bands. In this example those are signals above, e.g., 250 Hz. The high band (>250 Hz) Above Threshold Ratio (compression ratio) is set to 1000:1 to provide true limiting at the Target Level. The Target Level 316 is determined, while monitoring the speaker output, with the EQ 114 configured and with the TV Volume Control 126 set at full volume to determine the maximum allowable signal. The Target Level 316 will increase proportionally, via internal feedback, as the TV volume is decreased. In other words the high band compressor will allow more energy to pass as the volume control is lowered since it will be attenuated by the volume control prior to being present at the speaker terminals. The Max Gain and Below Threshold Ratio setting (1.2:1) will allow some mid and high band boost to occur when the input level, in conjunction with the TV volume control 126 setting, indicates more energy will be tolerated. In other words the high band compressor will allow more mid and high frequency energy as the volume control is lowered since it will be attenuated by the volume control prior to being present at the speaker terminals.

Compressor2 108: Configured to limit (or boost) the level in the low band relative to a target level setting. In this case the low band could be 250 Hz and below. Crossover Network1 104 is configured at 250 Hz. The filter order is set to 4th to optimize the separation of the two bands (<250 Hz and >250 Hz). The Target Level 316 sets the limit, for this band, in dB full scale. The Target Level 316 is set, while monitoring the speaker output, with the Volume Control 126 at full volume and with the EQ 114 configured with any desired static boost <250 Hz. Setting the Target Level 316 in this manner allows the maximum amount of energy <250 Hz allowable (before distortion occurs) to reach the speaker terminals at full volume. At lower volume settings the Volume Control feedback will allow more bass signal to pass. This configuration allows the system to always pass as much bass signal as possible, without distortion, while utilizing EQ to provide a static boost to the low band. The Maximum Compressor Gain could be set to a low value (2-3 dB) to allow a small amount of additional dynamic boost at low bass input levels. Above and below threshold compression ratios are set relatively high (16:1).

Advanced Surround 112: Configured with a moderate to small amount of sound field spread (Width) with a Delay, Delay Feedback and Delay Gain configuration that is dominated by early reflections giving the subtle feeling of 3D sound without sacrificing clarity.

EQ 114: Configured to flatten the speaker frequency response in mid to high bands and to boost the response in the low band. This creates good overall tonal balance while providing the desired amount of bass boost.

Compressor 3 118: Configured to limit very low frequency signals (<<250) that are not passable by the speakers at high, or even moderate, output levels. This lower low band is set in Crossover Network2 104. Continuing the example, let's say it is set to 100 Hz. The Target Level can be set to a level (lower than the Compressor2 108 Target Level 316) that will allow these very low frequency signals to still pass (at limited levels) and even boost them, via the Max Gain and Below Threshold Ratio parameters, if the input signal level and volume control 126 setting will allow. The Target Level is set when the TV is at full volume, while monitoring the speaker output, to determine the maximum allowable signal but will then be increased proportionally, via internal feedback, as the TV volume is decreased. In other words the low-low band compressor will allow more energy to pass as the volume control is lowered since it will be attenuated by the volume control prior to being present at the speaker terminals. The HPF is preferably configured to remove those extremely low frequencies that absolutely cannot be reproduced by the speaker.

Soft Clip 124: Configured to limit signals above 0 dB full scale.

By dividing the speaker low band into two bands, the configuration described above allows lower than typical frequencies to be passed by the speakers. In prior art, a HPF would typically be used to remove the lower-low band frequencies from the audio signal. This new compressor configuration allows them to be passed if conditions (low input level, low volume control setting) merit. All these parameter settings are calibrated for a given set of speakers mounted in a specific enclosure.

Concert Hall Mode: A concert hall mode can be created, for the example speaker, by the following configuration.

DPP 102: Same as bass-emphasized music mode.
Compressor1 106: Same as bass-emphasized music mode.
Compressor2 108: Same as bass-emphasized music mode.
Advanced Surround 112: Increase the Delay Time and Delay Feedback Coefficient for both the L+R and L−R channels so that the overall impulse response extends well into the reverberation region.
EQ 114: Same as bass-emphasized music mode.
Compressor3 118: Same as bass-emphasized music mode.
Soft Clip 124: Same as bass-emphasized music mode.

Broadcast Sports Mode: A broadcast sports mode can be created by the following configuration:

DPP 102: Limit the L−R/L+R ratio to −6 dB. This reduces the ambient audio (crowd noise, public address announcer). Increase the Center Gain (via multiplier 210) to emphasize the broadcast announcer's voice. This gives the announcer's voice more perceived clarity without sacrificing the overall bandwidth of the audio signal. Prior art implementations have implemented a bandpass filter to pass voice frequencies while attenuating signals outside of the voice range.

Compressor1 106: Configure, similar to bass-emphasized music mode, to limit the audio output so as to not overdrive the speakers at frequencies >100 Hz at full volume. Crossover Network1 104 is configured at 100 Hz.

Compressor2 108: Disable by setting the Above Threshold Compression Ratio and Below Threshold Compression Ratio to 1:1.

Advanced Surround 112: Configure L-R Delay loop (Delay and Delay Feedback Coefficient) to generate an impulse in the reverberation region. The L+R delay loop 424 is disabled by setting the sum delay gain to 0. While the L-R channel is reduced by DPP, the reverberation on the remaining difference signal retains the enveloping feel of stadium crowd noise. Disabling the L+R delay loop maintains the broadcast announcer's vocal clarity.

EQ 114: Configure to compensate for speaker frequency response and to provide bass boost.

Compressor3 118: Configured to improve the speaker's bass response by limiting (or boosting) the level in the low band relative to a target level setting. In this case the low band would be 250 Hz and below. Crossover Network2 116 is configured at 250 Hz. The Target Level 316 is set with the Volume Control at full volume and with the EQ fully configured with any desired boost <250 Hz. Setting the Target Level in this manner allows the maximum amount of energy <250 Hz allowable (before distortion occurs) to reach the speaker terminals at full volume. At lower volume settings the Volume Control feedback will allow more bass signal to pass. This configuration allows the system to always pass as much bass signal as possible, without distortion, while utilizing EQ to boost the low band. The HPF is configured to remove the low frequencies that cannot be reproduced by the speaker in this configuration.

Soft Clip 124: Configured to limit signals above 0 dB full scale.

The components, steps, features, objects, benefits, and advantages that have been discussed are merely illustrative. None of them, or the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

For example, in bass-emphasized music mode the roles of Compressor2 and Compressor3 could be reversed. Compressor2 could compress the lower low band and Compressor3 could compress the upper low band. Additionally, the HPF could be located after the summer. The Volume Control could be positioned before Crossover Network2 eliminating the need for Volume Control feedback.

Unless otherwise stated, all measurements, values, ratings, positions, magnitudes, sizes, and other specifications, including frequencies, ratios, and dB values, that are set forth in this specification, including in the claims that follow, are approximate and/or provided as example, are not necessarily exact or invariable. They (the values described) are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element proceeded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

What is claimed is:

1. A system for enhancing a perception of a center image in stereo audio, while maintaining a defined limit of a difference to sum ratio ((L−R)/(L+R)) based upon a threshold setting of a difference channel, the system comprising:
   a dual processing protection (DPP) processor operative to receive left (L) and right (R) signals from left (L) and right (R) audio channels, respectively, as inputs and configured to limit the audio difference to sum ratio ((L−R)(L+R)) by attenuating the audio difference signal, thereby producing an attenuated difference signal, and increasing the level of the sum signal, wherein the level of the sum signal represents center gain, wherein the DPP processor is operative to produce left and right output signals;

a first crossover network configured to receive the left and right output signals from the DPP processor as input signals and to separate each of the left and right input signals into a plurality of frequency bands, including a high band and a low band, wherein the crossover network produces left and right output signals for each band and wherein the crossover network is configurable by a user to set a crossover frequency and filter order of the first crossover network;

first and second compressors, wherein the first compressor is configured to receive the left and right high band output signals from the first crossover network and to produce compressed left and right high band output signals corresponding to the high band, and wherein the second compressor is configured to receive the left and right low band output signals from the first crossover network and to produce compressed left and right low band output signals corresponding to the low band, and wherein the first and second compressors are configured to limit a maximum loudness of the high and low bands;

a two channel surround processor configurable to receive the outputs from the first and second compressors and set the amount of perceived sound field spread in multiple dimensions by calculating the attenuated difference signal (L−R) resulting from processing of the DPP processor and to generate left and right output signals;

a stereo equalizer configured to receive the left and right audio output signals from the two channel surround processor and shape the spectral characteristics such that the overall bandwidth of the audio material is not compromised when subjected to the playback on system speakers, wherein the stereo equalizer is configured to produce left and right output signals;

a soft clipper operative to receive as inputs compressed stereo left and right input signals, wherein the soft clipper is configured to limit the perceived distortion of left and right signals that briefly exceed a full scale output when subjected to the center gain, and dynamics of the first and second compressors, and to produce a stereo output.

2. The system of claim 1, wherein the system is configurable to produce desired sound listening modes.

3. The system of claim 2, further comprising a second crossover network configured to receive the left and right output signals from the stereo equalizer as left and right input signals, and to separate each of the left and right input signals into a plurality of frequency bands, including a high band and a low band, wherein the second crossover network produces left and right output signals for each band.

4. The system of claim 3, further comprising a third compressor configured to receive the left and right output of the second crossover network and to limit the amount of low frequency audio energy in a band defined by a system speaker low frequency response and configured to dynamically boost the audio level when the audio level is below the limit threshold, wherein the system is configured for bass-enhanced music listening.

5. The system of claim 1, wherein the filter order of the at least one crossover network is $4^{th}$ order.

6. The system of claim 1, further comprising a volume control configured to produce a volume control setting to adjust a level of a stereo input signal.

7. The system of claim 6, wherein the volume control is configured to receive a stereo input and to feed the volume control setting forward to at least one of the stereo compressors.

8. The system of claim 6, wherein the volume control is configured to receive a stereo input and to feed the volume control setting back to at least one of the stereo compressors.

* * * * *